United States Patent
Jang et al.

(10) Patent No.: US 6,992,420 B2
(45) Date of Patent: Jan. 31, 2006

(54) FILM BULK ACOUSTIC RESONATOR AND METHOD OF FORMING THE SAME

(75) Inventors: Jae Wook Jang, Kyungki-do (KR); Kuk Hyun Sunwoo, Kyungki-do (KR)

(73) Assignee: Samsung Electro-Mechanics Co., Ltd., Kyungki-do (KR)

(*) Notice: Subject to any disclaimer, the term of this patent is extended or adjusted under 35 U.S.C. 154(b) by 282 days.

(21) Appl. No.: 10/320,361

(22) Filed: Dec. 17, 2002

(65) Prior Publication Data

US 2003/0193269 A1    Oct. 16, 2003

(30) Foreign Application Priority Data

Apr. 11, 2002    (KR) ........................................ 2002-19825

(51) Int. Cl.
H01L 41/08    (2006.01)
H03H 9/02    (2006.01)

(52) U.S. Cl. ..................... 310/324; 310/312; 310/346; 310/349; 310/367; 310/341; 310/321

(58) Field of Classification Search ................ 310/324, 310/321, 341, 346, 347, 312, 349, 36, 330, 310/348, 366; 427/100; 333/188; H02K 41/08
See application file for complete search history.

(56) References Cited

U.S. PATENT DOCUMENTS 5,873,154 A    2/1999    Ylilammi et al.
6,051,907 A    4/2000    Ylilammi et al.
6,617,751 B2 *    9/2003    Sunwoo et al. ............. 310/324
6,788,170 B1 *    9/2004    Kaitila et al. ............... 333/187
6,828,713 B2 *    12/2004    Bradley et al. ............. 310/324

FOREIGN PATENT DOCUMENTS

KR    2001-29007    4/2001
KR    2001-97701    11/2001

* cited by examiner

Primary Examiner—Darren Schuberg
Assistant Examiner—J. Aguirrechea
(74) Attorney, Agent, or Firm—Lowe Hauptman & Berner, LLP

(57) ABSTRACT

A film bulk acoustic resonator (FBAR) includes an insulation layer on a substrate to prevent a signal from being transmitted to a substrate. The FBAR includes a portion of a membrane layer corresponding to an activation area to adjust a resonance frequency band and improve a transmission gain of the resonance frequency band, the portion of the membrane layer being partially etched to have a thickness less than the other portion of the membrane layer. A method of forming the FBAR includes forming an sacrificing layer made of polysilicon, forming an air gap using a dry etching process, and forming a via hole. The method prevents structural problems occurred in a conventional air gap forming process and provides locations and the number of the via holes to be controlled.

37 Claims, 14 Drawing Sheets

US 6,992,420 B2

FILM BULK ACOUSTIC RESONATOR AND METHOD OF FORMING THE SAME

CROSS-REFERENCE TO RELATED APPLICATIONS

This application claims the benefit of Korean Application No. 10-2002-19825, filed Apr. 11, 2002, in the Korean Intellectual Property Office, the disclosure of which is incorporated herein by reference.

BACKGROUND OF THE INVENTION

1. Field of the Invention

The present invention relates to a film bulk acoustic resonator and a method of manufacturing the same, and more particularly, to a film bulk acoustic resonator and a method of forming the same having a thermal oxidation layer and a stable resonating structure easily formed by a dry etching process.

2. Description of the Related Art

Recently, components, such as a radio frequency related component, used in a mobile communication terminal have been rapidly improved according to a tendency toward minimization and multi-function of the mobile communication terminal. A filter, one of critical components in the mobile communication terminal, performs a function of filtering a predetermined signal or selecting a desired signal in radio frequency signals.

Particularly, as a frequency band used in the mobile communication terminal becomes higher, a component used for an ultra (super) high frequency band is required. However, the super high frequency band component is difficult in minimizing in size and lowering a manufacturing cost. For example, a conventional dielectric resonator and filter used in the frequency band of more than 1 GHz cannot be integrated into the minimized and multi-functional mobile communication terminal due to the bulky size and shape of the conventional resonator and filter.

Although an acoustic surface resonator or crystal resonator replacing a dielectric resonator has been introduced, an insertion loss is still greater than the conventional resonator, and it is impossible to integrate and minimize the acoustic surface resonator in a desired size and volume. Moreover, the manufacturing cost is not decreased.

In an effort to solve the above problems, a film bulk acoustic wave resonator (FBAR) and a thin film resonator (TFR) using thickness vibration of a piezoelectric layer have been recently proposed.

In the FBAR, a thin layer made of a dielectric material, such as ZnO or AlN, is formed on a semiconductor substrate, such as silicon and GaAs, to generate a resonance using a piezoelectric characteristic of the thin layer. It is possible to reduce a manufacturing cost and a weight of the thin layer and to maintain a high quality of the thin layer. The thin layer can be used in wireless communication apparatus and equipment having the super high frequency band of 900 MHz–10 GHz. The thin layer is minimized ten times less than the dielectric filter and has the insertion loss less than the surface acoustic wave component.

Generally, the FBAR is formed with a lower electrode, a piezoelectric layer, and an upper electrode formed on a silicon substrate in order. The silicon substrate is prevented from being affected by the a bulk acoustic wave generated in the piezoelectric layer due to magnetic fields formed by the upper and lower electrodes.

The FBAR requires an additional separating structure separating the silicon substrate from a resonating (activation) area of the upper electrode, the piezoelectric layer, and the lower electrode to improve the electric efficiency, such as the insertion loss and a transmitting gain, and a manufacturing process of the FBAR. The separating structure of the FBAR is classified into a reflective layer structure using the Bragg reflection and an air gap structure having an air gap between the silicon substrate and the resonating (activation) area of the upper electrode, the piezoelectric layer, and the lower electrode.

FIG. 1A is a cross-sectional view of a conventional FBAR having a reflective layer, and FIG. 1B is a cross-sectional view of another conventional FBAR having an air gap.

Referring to FIG. 1A, the FBAR includes a substrate 11, a reflective structure having first and second reflective layers 12a, 12b, and a resonator (activation) area formed by a first electrode 17, a piezoelectric layer 18, and a second electrode 19. The substrate 11 is separated from the resonator area of the first and second reflective layers 12a, 12b having a difference in an acoustic impedance. The first and second reflective layers 12a, 12b are repeatedly formed in the reflective structure to separate the substrate 11 from the resonator area. The reflective structure is the separating structure using the acoustic difference between the first and second structure disposed in a lower portion of the resonator area. This is called a solidly mounted resonator (SMR).

However, the first and second layers 12a, 12b should have the same thickness as a quarter wavelength of a resonating frequency, and a stress generated between the first and second layers should be considered when the first and second layers 12a, 12b are repeatedly formed in the reflective structure. Accordingly, a manufacturing process becomes complicated, and the manufacturing cost is increased. In addition, the SMR is lower than the air gap method in reflective characteristics and limited in being implemented as a resonator due to a decreased effective bandwidth.

In an effort to overcome the above problems, an FBAR having the air gap according to an air gap bridge method has been introduced. According to FIG. 1, the FBAR forms a sacrificing layer on a substrate 21 to form an air gap A1. A first electrode 27 and a piezoelectric layer 28, and a second electrode 29 are formed in order after a membrane layer 25 having an insulation layer is formed on the substrate 21. The sacrificing layer is removed by being etched through a via hole, and the air gap A1 is finally formed. Although the FBAR having the air gap A1 is easily manufactured and has the reflective characteristics better than the SMR, the structure of the membrane layer is deformed and separated from the substrate 21 during forming the FBAR having the air gap because the membrane layer is very unstable.

In order to solve the above problems, an additional layer is provided to support the membrane layer, and another layer is formed to surround the membrane layer of the FBAR. A cross-sectional view of the FBAR is shown in FIG. 2A. FIG. 2B is a plan view of the FBAR of FIG. 2A.

According to FIGS. 2A and 2B, the FBAR includes a substrate 31, a supporting layer 35 formed on the substrate 31 to include an air gap A2, a membrane layer 36 formed on the supporting layer 35, and a resonator (activation) area formed by a first electrode 37, a piezoelectric layer 38, and a second electrode layer 39 formed on the membrane layer 36 in order. The supporting layer 35 supports the membrane layer 36 and includes the air gap A2. The FBAR as shown in FIG. 2A, prevents the membrane layer 36 from being deformed and separated from the substrate 31 during forming a via hole H and removing a photo resist by strengthening a structure of the membrane layer 36. This enables the FBAR to be relatively stable and solid.

However, since the conventional FBAR of FIGS. 2A and 2B includes the substrate made of silicon doped with impurity to have a high electric conductivity, a high frequency of more than 1 GHz may be transmitted to the substrate 31 from the activation area of the first electrode 37, the piezoelectric layer 38, and the second electrode layer 39. As a result, characteristics of the conventional FBAR deteriorate when the FBAR is implemented in an integrated circuit operating in the high frequency band.

After an etching operation is performed to form the air gap A2, the FBAR may become unstable due to a bonding force exerted on the membrane layer 36 having the support layer 35 surrounding the air gap A2. An etchant solution effects the membrane layer 36 because of the bonding force of the etchant solution which is used to remove the sacrificing layer formed with metal oxide, such as ZnO, or a metal, such as Al, Cu, and NiFe.

In addition, when the etchant solution is supplied to the sacrificing layer, the etchant solution may etch the piezoelectric layer 38 when a via hole H is formed to couple the sacrificing layer and an outside of the FBAR. Therefore, the via hole H should be formed on an outside area of the activation (resonator) area. When the via hole H is formed on a corner portion of the activation area, at least four via holes H should be formed on each corner portion of the activation area. In the conventional FBAR, the number of via holes H and a location of the via holes H are very limited. As a result, the number of the vie holes H is increased, the via holes H formed on a specific position of the FBAR badly effects the characteristics of the FBAR.

Although an undercut of the FBAR may be prevented in a conventional sacrificing layer forming process using an dry etching operation of the photo resist after a wet etching operation of the sacrificing layer, this process is very complicated, and the undercut is not easily controlled. If a wing tip is generated due to a lower side profile angle of the photo resist during the above process, the structure of the FBAR becomes weak and easily deformed. According to FIGS. 3A and 3B, a sacrificing layer 43 is formed on a substrate 41, a photo resist layer 44 having the low side profile angle θ1 is formed on the sacrificing layer 43 to form an air gap area, and a sacrificing area 43' is formed corresponding to the air gap by etching the sacrificing layer by reactive ion etching (RIE). The lower side profile angle θ1 of the photo resist layer 44 is lowered than the conventional photo resist because a material of the photo resist layer 44 has a higher etching ratio than that of the sacrificing layer 43. Accordingly, the wing tip is generated due to the lowered side angle of the sacrificing layer when the photo resist layer 44 is lifted off from a membrane layer after a membrane layer forming operation is performed. In addition to the above problems, the resonator frequency is not easily controlled in the above conventional FBAR.

SUMMARY OF THE INVENTION

In order to overcome the above and other problems, it is an object to provide a FBAR having a high reflective characteristic and a lower insertion loss and to prevent signals generated in a resonator area from being transmitted to a substrate.

It is another object to provide a method of forming a FBAR. The method includes stably forming an air gap and preventing a structure relating to the air gap of the FBAR from being weakened.

Additional objects and advantages of the invention will be set forth in part in the description which follows and, in part, will be obvious from the description, or may be learned by practice of the invention.

The above and other objects according to an embodiment of the present invention, may be achieved by providing a FBAR including a substrate, an insulation layer formed on the substrate, a membrane supporting layer formed on the insulation layer, a membrane layer formed on the membrane supporting layer, a first electrode formed on the membrane layer, a piezoelectric layer formed on the first electrode, and a second electrode formed on the piezoelectric layer.

According to an aspect of the present invention, the insulation layer reduces an insertion loss by electrically blocking the substrate from being affected by a high frequency signal, and the insulation layer is a thermal oxidation layer being made of one of an oxidization layer, an nitride layer, and a porous silicon layer which easily grow on a silicon substrate. And a substrate having the high insulation resistance, for example non-doped high resistance Si wafer (>5000Ω), glass wafer, quartz wafer, sapphire, LN(LiNbO$_3$), LT(LiTiO$_3$), may be used. In this case, the insulation layer cannot be required.

The above and other objects according to another embodiment of the present invention, may be achieved by providing the FBAR including a substrate, a membrane support layer formed on the substrate and having an air gap, a membrane layer formed on the membrane support layer and having a portion corresponding to the activation area and having a thickness less than the other portion of the membrane layer, a first electrode formed on the membrane layer, a piezoelectric layer formed on the first electrode layer, and a second electrode formed on the piezoelectric layer.

According to another aspect of the present invention, the membrane layer may have two different thicknesses to effectively control a center frequency of a resonance frequency and improve a transmission gain. A portion of the membrane layer is formed by a dry etching process to form a subsiding top surface corresponding to the activation area.

According to still another aspect of the present invention, the FBAR includes a substrate, a membrane support layer formed on the substrate and having an air gap, a membrane layer formed on the membrane support layer, a first electrode formed on the membrane layer, a piezoelectric layer formed on the first electrode layer, a second electrode formed on the piezoelectric layer, and at least one via hole formed in the first electrode, the piezoelectric layer, and the second electrode to communicate with the air gap.

Since the via hole is formed in the activation area to communicate with a central portion of the sacrificing layer, the number of the via holes decreases, and a resonance characteristic of the FBAR is improved.

The above and other objects according to another embodiment of the present invention, may be achieved by providing a method of forming the FBAR. The method includes forming an insulation layer on a substrate, forming a sacrificing layer on the insulation layer, partially removing the sacrificing layer except a portion of the sacrificing layer corresponding to an air gap forming area, forming a membrane support layer on the insulation layer on which the sacrificing layer is removed, forming a membrane layer on the membrane support layer and the portion of the sacrificing layer, forming a first electrode on the membrane layer, forming a piezoelectric layer on the first electrode layer, forming a second electrode on the piezoelectric layer, and forming an air gap by removing the portion of the sacrificing layer.

According to another aspect of the present invention, the forming of the sacrificing layer may include forming a photo resist layer on the portion of the sacrificing layer corresponding to the air gap forming area, dry etching the sacrificing layer except the portion of the sacrificing layer covered by the photo resist, and removing the photo resist from the portion of the sacrificing layer.

According to yet another aspect of the present invention, the membrane support layer is formed before the photo resist is removed from the portion of the sacrificing layer. When the photo resist is formed, a side profile angle of the photo resist is adjusted in a range between 70 degrees and 90 degrees with respect to a perpendicular line to the substrate or the insulation layer after the sacrificing layer is dry etched. The side profile angle is adjusted to form an sacrificing area as an undercut structure to prevent a wing tip generated when a lift off process is performed to lift off the photo resist from the insulation layer.

According to still yet another aspect of the present invention, the FBAR improves a transmission gain of the resonance frequency and control the resonance frequency. The method further includes etching the membrane layer to form a subsided plane corresponding to the activation area by using a dry etching process before the first electrode is formed.

According to also another aspect of the present invention, the method avoids problems, such as a structural deformation by a bonding force caused by an etchant solution used in the wet etching process, occurring in the wet etching process to form the air gap. The method includes forming a ploy silicon layer as the sacrificing layer and removing the sacrificing area of the sacrificing layer corresponding to the air gap. It is possible to use XeF2 as an etching gas applied in the dry etching process. Since the sacrificing layer is made of a material being different from that of the activation area, such as a material of the piezoelectric layer, and since a new etching process is used in this method, the via hole may be formed in various locations to provide a supply passage of the etchant liquid used in the etching process.

According to further aspect of the present invention, any combination of the above embodiments may be used to form the FBAR.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1A:
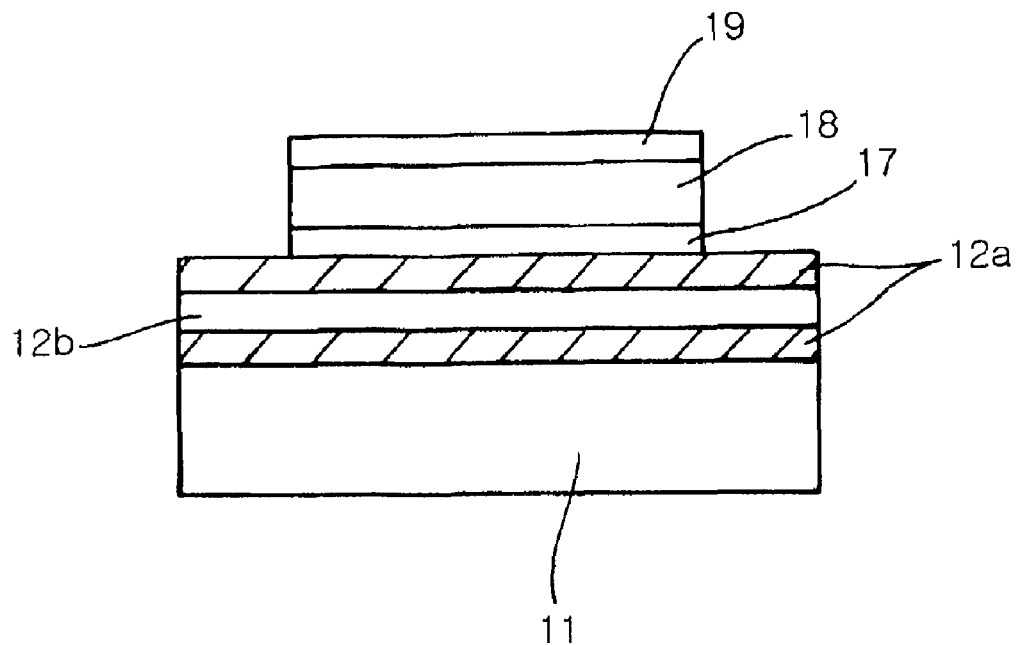
FIGS. 1A and 1B are cross-sectional views of a conventional FBAR of a thin film filter.
Figure 1B:
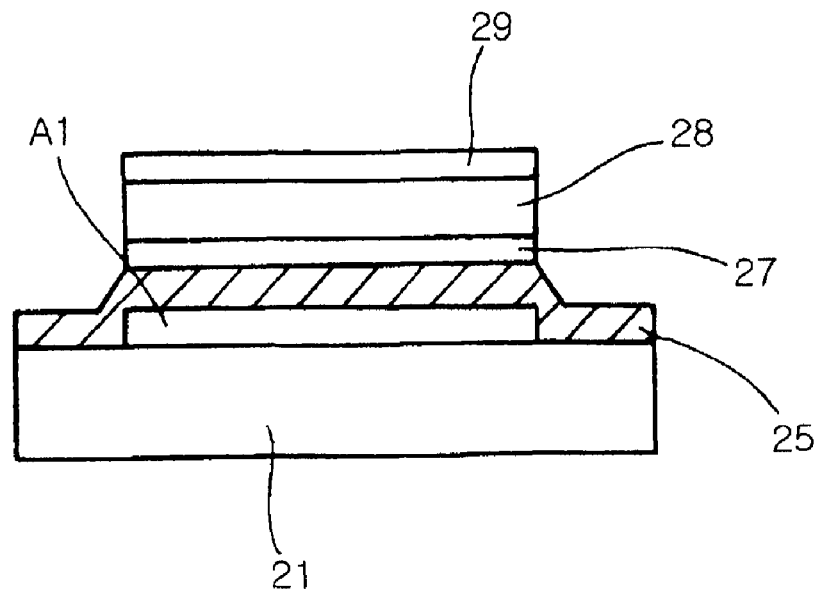
Figure 2A:
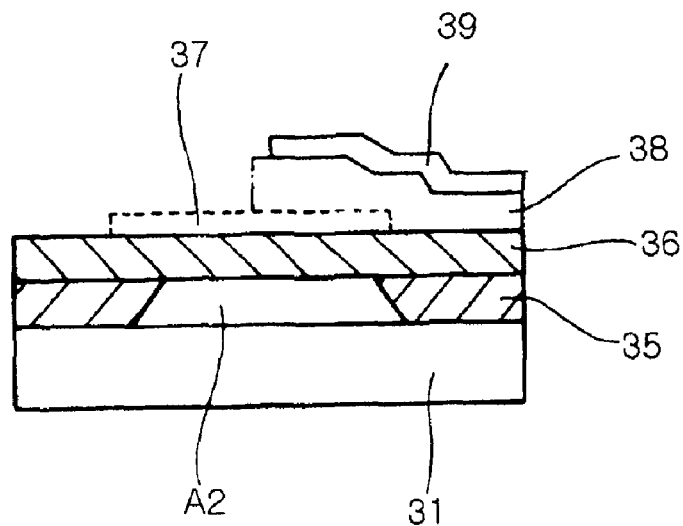
FIGS. 2A and 2B are a cross-sectional view and a plan view of a conventional FBAR using a membrane supporting layer in a thin film filter, respectively.
Figure 2B:
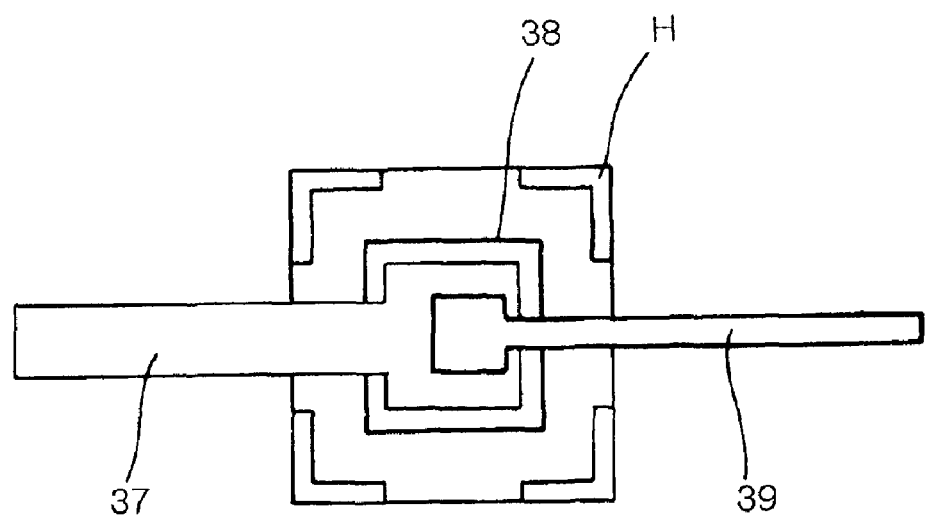

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 4A:
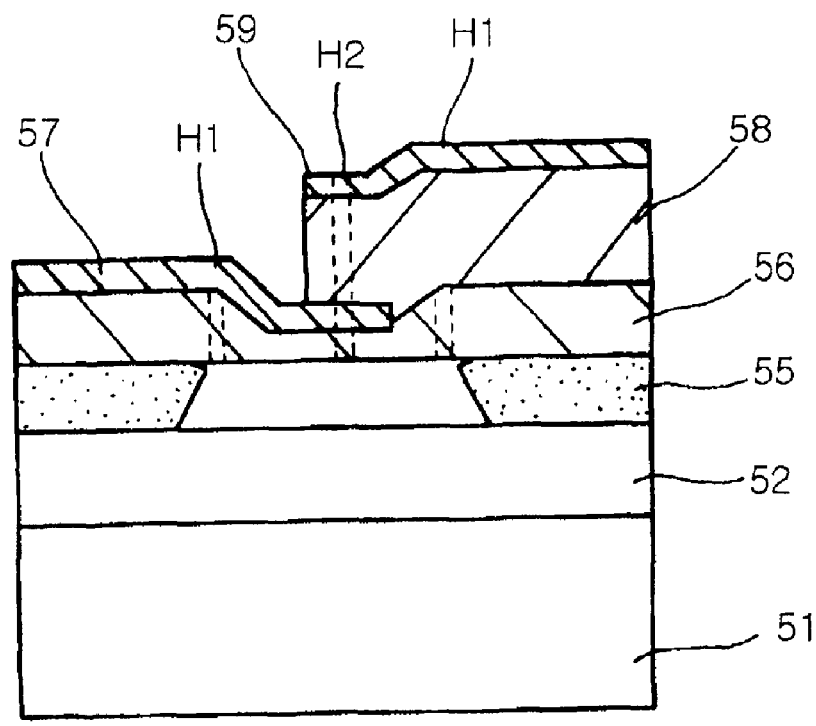
FIGS. 4A and 4B are a cross-sectional view and a plan view of a FBAR according to an embodiment of the present invention, respectively.
Figure 4B:
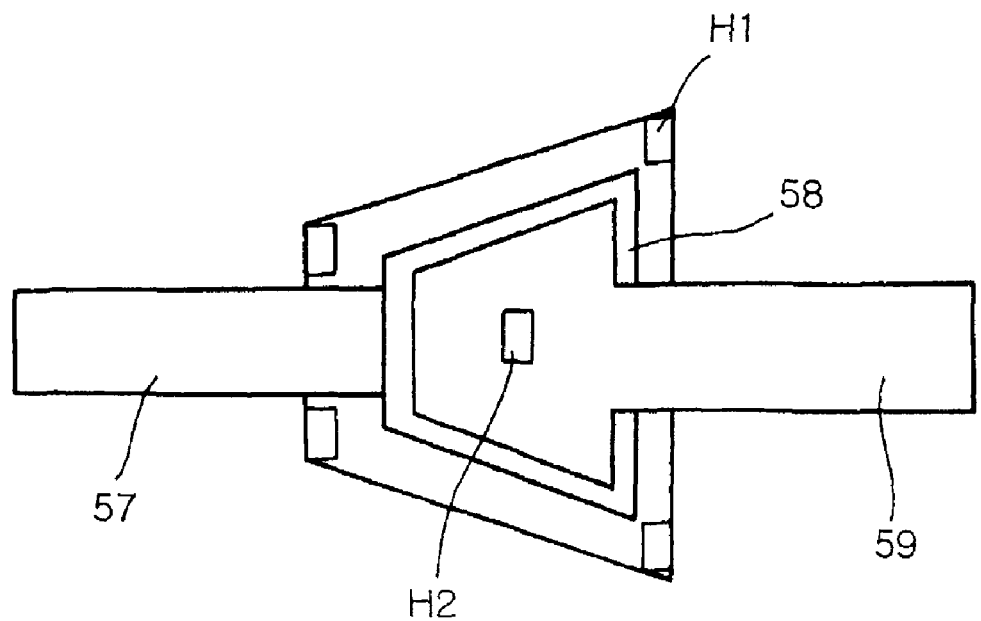

FIGS. 4A and 4B are a cross-sectional view and a plan view of a FBAR according to an embodiment of the present invention, respectively. Referring to FIG. 4A, the FBAR includes a substrate 51, an insulation layer 52 formed on the substrate 51, a membrane supporting layer 55 formed on the insulation layer 52 to have an air gap A3, a membrane layer 56 formed on the membrane supporting layer 55, a first electrode 57 formed on the membrane layer 56, a piezoelectric layer 58 formed on the first electrode 57, and a second electrode 59 formed on the piezoelectric layer 58.

According to this embodiment of the present invention, an insertion loss is reduced because the insulation layer 52 is formed on the substrate 51. When a voltage is supplied to the first electrode 57 and the second electrode 59, a predetermined frequency signal generated from an activation (resonator) area of the first and second electrodes 57, 59 and the piezoelectric layer 58 may be transmitted to the substrate 51 in a conventional FBAR. Moreover, characteristics of the conventional FBAR become lowered due to an increased insertion loss. When a substrate doped with impurity in the conventional FBAR has a high conductivity, and when the conventional FBAR is used in a high frequency integrated circuit having a frequency band of more than 1 GHz, the characteristics of the conventional FBAR deteriorates because the insertion loss becomes greater. However, the FBAR according to a first characteristic of the present invention, prevents signals generated from the activation area from being transmitted to the substrate 51 due to the insulation layer 52 formed between the substrate 51 and the membrane supporting layer 55. As a result, the FBAR of FIG. 4A improves the characteristic of the insertion loss.

This insulation layer 52 uses a thermal oxidation layer which easily grows on the substrate made of silicon or one of an oxidation layer and a nitride layer formed by a chemical vaporization sputtering process or a conventional vaporization sputtering process. It is possible that a thickness of the thermal oxidation layer having an insulation characteristic is between about 0.5 $\mu$m and about 5 $\mu$m, It is also possible that a thickness of the thermal oxidation formed with porous silicon is between 5 $\mu$m and 50 $\mu$m.

According to another characteristic of this embodiment of the present invention, a central frequency of a resonate frequency band is effectively controlled, and a transmission gain is improved by adjusting a thickness of the membrane layer 56 corresponding the activation area. As shown in FIG. 4A, a portion of the membrane layer 56 corresponding to the activation area is a subsiding plane by a subsiding distance. A thickness of the portion of the membrane layer 56 disposed below the activation area of the piezoelectric layer 58 and above the air gap A3 is less than other portion of the membrane layer 56 by the subsiding distance. With this subsiding portion, the central frequency is controlled, and the transmission gain is improved. The subsiding portion of the membrane layer 56 is formed by using an etching process before the first electrode 57 is formed on the membrane layer 56.

Although the FBAR of FIG. 4A includes the first and second characteristics according to this embodiment of the present invention, each of the first and second characteristics may be independently and separately implemented in the FBAR.

According to this embodiment of the present invention, a process of forming the FBAR is provided, and the process includes effectively forming the air gap and preventing a wing tip problem generated when a photo resist is lifted off from a sacrificing layer after a membrane supporting layer is formed.

FIGS. 5A through 5J are cross-sectional views illustrating each process of forming the FBAR of FIGS. 4A and 4B.

Figure 5A:
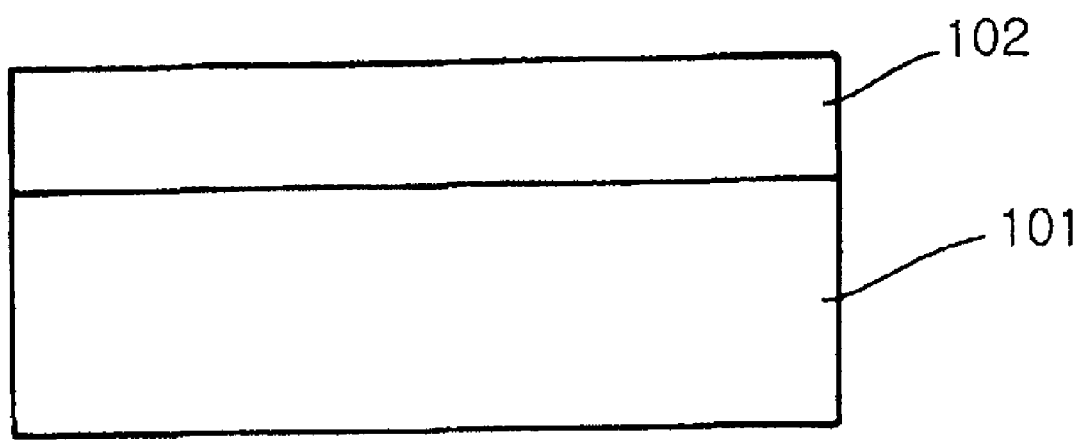
FIGS. 5A through 5J are cross-sectional views illustrating a process of forming the FBAR of FIGS. 4A and 4B.

As shown in FIG. 5A, an insulation layer 102 is formed on a substrate 101. The insulation layer 102 may be a thermal oxidation layer formed on the substrate 101 of silicon by using a high thermal oxidation method. The silicon substrate 101 may be made of one of a silicon wafer doped with impurity and a high quality of a high resistance silicon wafer not doped with the impurity. The insulation layer 102 may be an oxidation layer or a nitride layer using a conventional deposition method, such as a chemical vapor deposition method, instead of the thermal oxidation layer formed on the substrate by the high thermal oxidation method. The insulation layer 102 may also made by a method of forming the thermal oxidation layer using the high thermal oxidation method from a porous silicon layer which is formed by electrolysis etching a silicon substrate. It is possible that the thermal oxidation layer has a thickness of about 0.5 $\mu$m to have a sufficient insulation characteristic to block a signal transmitted to the substrate 101. It is possible that the thermal oxidation layer may have a thickness of more than about 5 $\mu$m when the thermal oxidation layer is made using the porous silicon layer. Although the thickness of the thermal oxidation layer is described above, the present invention is not limited to the thickness of the thermal oxidation layer.

And a substrate having the high insulation resistance, for example non-doped high resistance Si wafer(>5000$\Omega$), glass wafer, quartz wafer, sapphire, LN(LiNbO$_3$), LT(LiTiO$_3$), may be used. In this case, an insulation layer is not required.

Figure 5B:
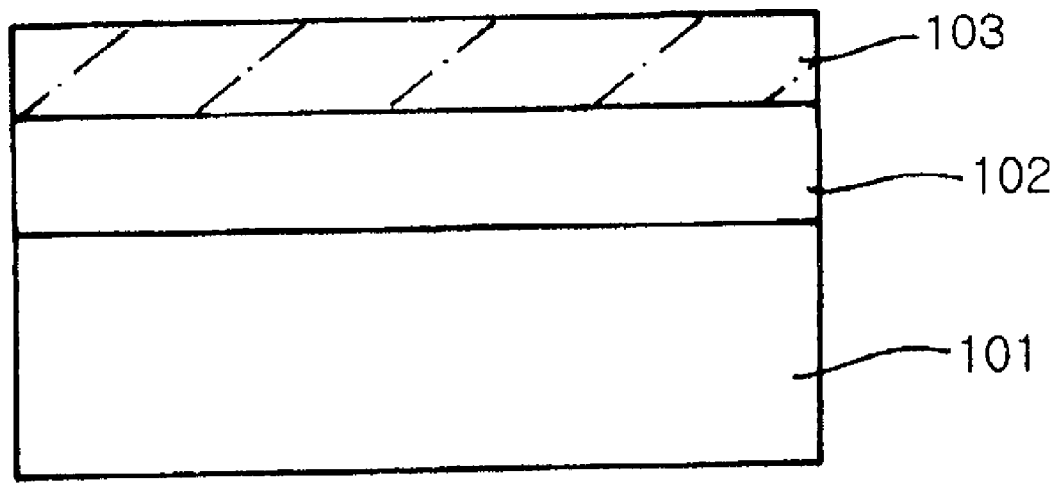
Figure 5C:
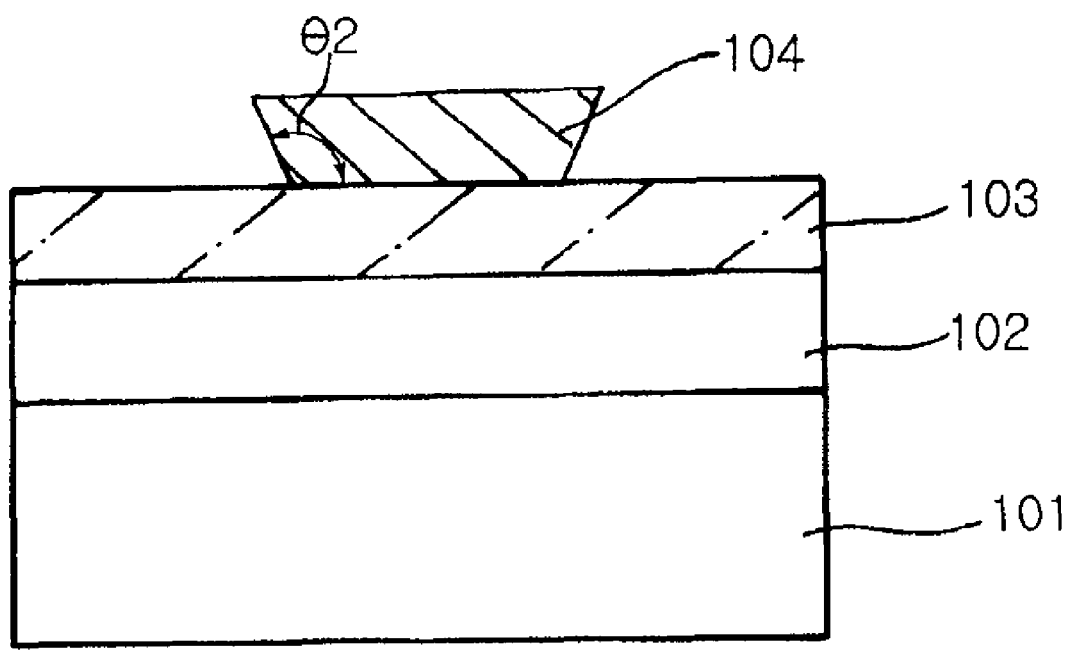
Figure 5D:
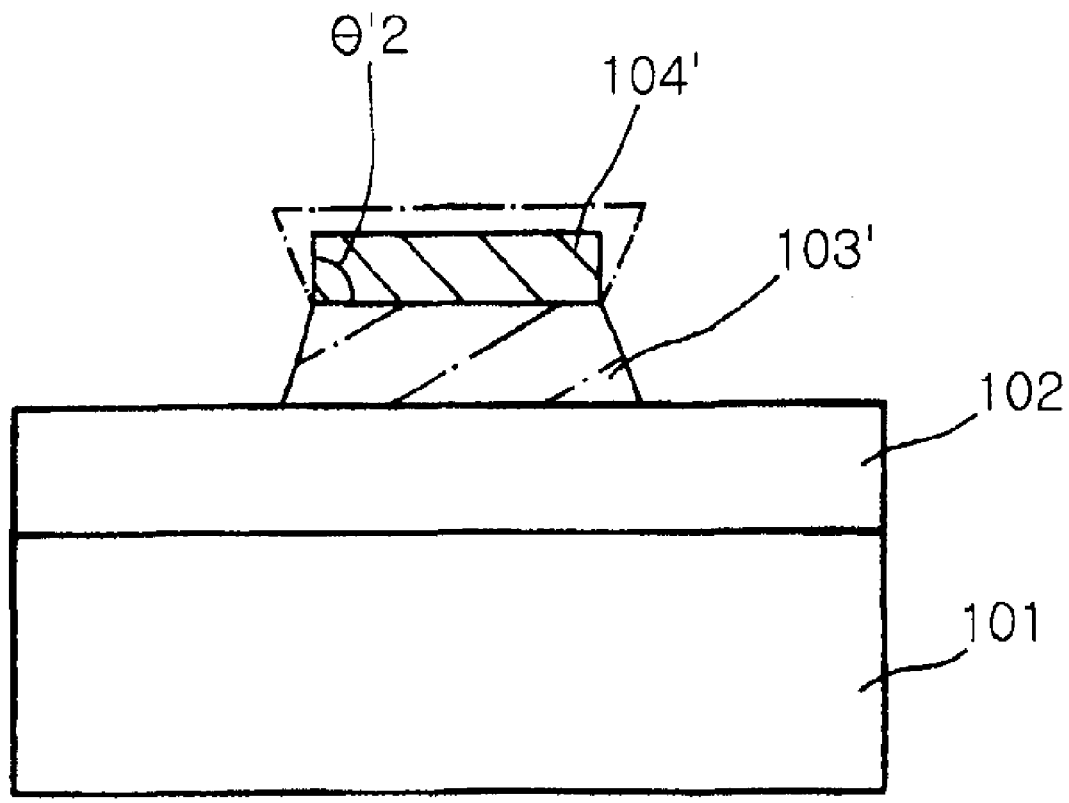

FIGS. 5B through 5D shows a precess of forming a sacrificing layer 103' formed on an upper surface of the insulation layer 102 which grows from the substrate 101 to form an air gap A3.

As shown in FIG. 5B, the sacrificing layer 103 is formed on the entire upper surface of the insulation layer 102. As an example, polysilicon is used as the sacrificing layer 103, has a good surface roughness to be easily formed and removed, and has advantages in being removed using a dry etching process in an following process.

In FIG. 5C, a patterned photo resist 104 is formed on an upper surface of the sacrificing layer 103 to define the air gap A3 formed by a photo etching process. The photo resist layer 104 is made of the same positive photo resist layer as that of FIGS. 6A and 6B. It is possible to use a negative or image reverse photo resist layer of FIG. 5C as the patterned photo resist 104. The negative or image reverse photo resist layer 104 has an undercut structure, such as a first side profile angle $\theta$2 greater than 90 degrees, which is different from a conventional photo resist pattern.

Figure 3A:
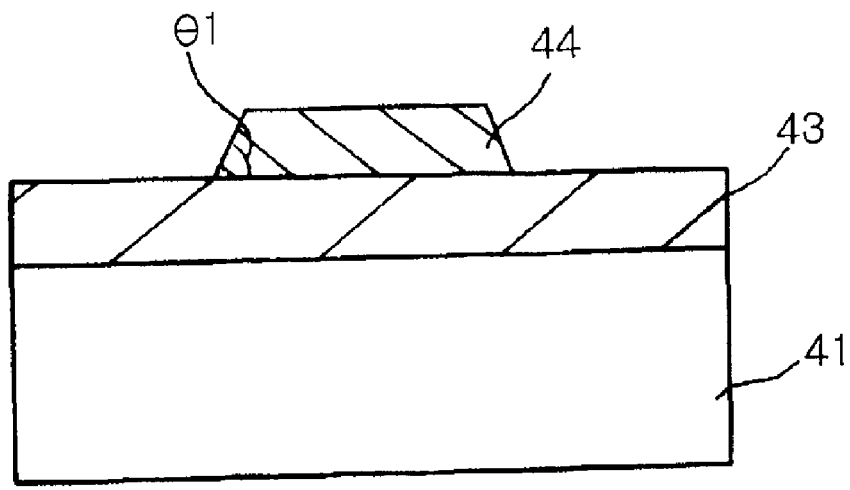
FIGS. 3A and 3B are cross-sectional views illustrating a conventional process of forming of a sacrificing layer to form an air gap in the FBAR.
Figure 3B:
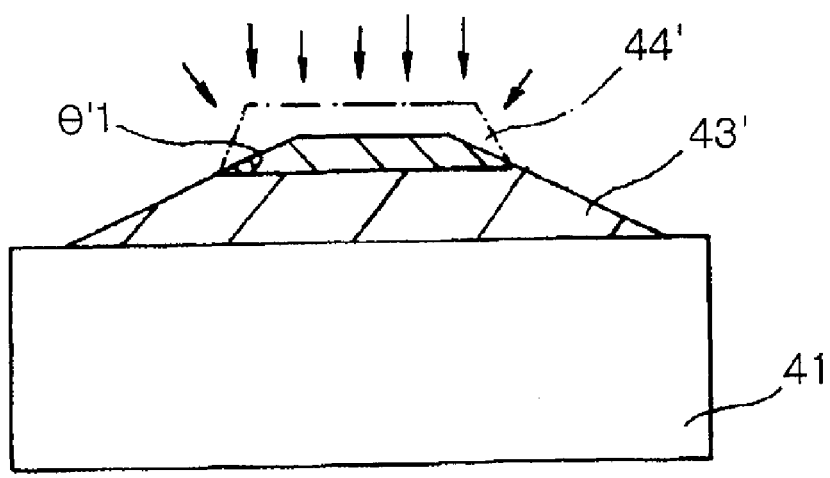

In FIG. 5D, an etching process is performed to form an sacrificing area 103'. The first side profile angle $\theta$2 of the photo resist layer 104' formed by the etching process may have a second side profile angle $\theta$'2 which is close to a right angle. A third side profile angle of the sacrificing area 103' increases compared with a conventional side profile angle $\theta$1 of FIG. 3B. As a result, with the increase of the third side profile angle of the sacrificing layer 103' or the first side profile angle $\theta$2 of the photo resist layer 104', problems of the wing tip generated when the photo resist layer 104' is lift off from the insulation layer 102 after the membrane support layer 105' is formed, is prevented. It is possible that the first side profile angle $\theta$2 of the photo resist layer 104' is controlled to be in a range between 70 degrees and 90 degrees. It is possible that the side profile angle $\theta$2 may be controlled to be perpendicular to the insulation layer.

The photo resist layer 104' of the present invention is not limited to the negative photo resistor or the image reverse photo resist as a process of controlling the first side profile angle $\theta$2 of the photo resist layer 104' in order to prevent the wing tip problem. The method may include making the side profile angle $\theta$2 of the photo resist layer 104' large. For example, a desired side profile angle can be obtained by lowering an etching rate of the photo resist layer 104' even if a positive photo resist layer is used as the photo resist layer 104'. As an example, a hard baking method of baking the photo resist layer 104' using a hot plate or another method of strengthening the photo resist layer 104' using an electron beam or a hardening agent can be used. These methods can be used as combined. A negative photo resist layer can be selectively used if necessary. It is possible that the hard baking method is used for lowering the etching rate in order to maintain the first side profile angle $\theta$2 to be a right angle and is performed in a circumstance having a temperature between about 100 degrees and about 200 degrees for one to ten minutes.

In addition, a large side profile angle can be obtained by adjusting an angle of the photo resist layer 104' in response to a change of the kind of the etching gas in the etching process. The right angle can be obtained as the first side profile angle $\theta$2 of the photo resist layer 104' by preventing the influence of the etching process by using a hard mask made of a metal without using the photo resist.

The above-mentioned conditions is applied to the dry etching process by using RIE(reactive ion etching). That is, if the another dry etching equipment is used, the wing tip problem may not be generated. Therefore, the process of controlling the side profile of the photo resist layer may not be required. And the another condition may be required in this case.

In the another dry etching process, ICR (inductive coupled plasma), and ECR (electron cyclotron resonance) can be selectively used. The dry etching gas is at least one of $C_xF_y$, $SF_6$, $Cl_2$ or a compound of a combination of $C_xF_y$, $SF_6$, $Cl_2$. The first side profile angle $\theta$2 of the photo resist layer 104' can be adjusted by controlling power, pressure, fluid amount of equipment, a state of the photo resist layer 104', and a condition of the etching gas.

The dry etching process improves the first side profile angle $\theta$2 of the photo resist layer 104' to improve the third side profile angle of the sacrificing layer 103' etched using the dry etching process. As described above, any combination of using a different mask, strengthening a photo resist layer, and optimizing each condition of the etching process may be used to form the photo resist layer 104' and the sacrificing layer 103'.

Figure 5E:
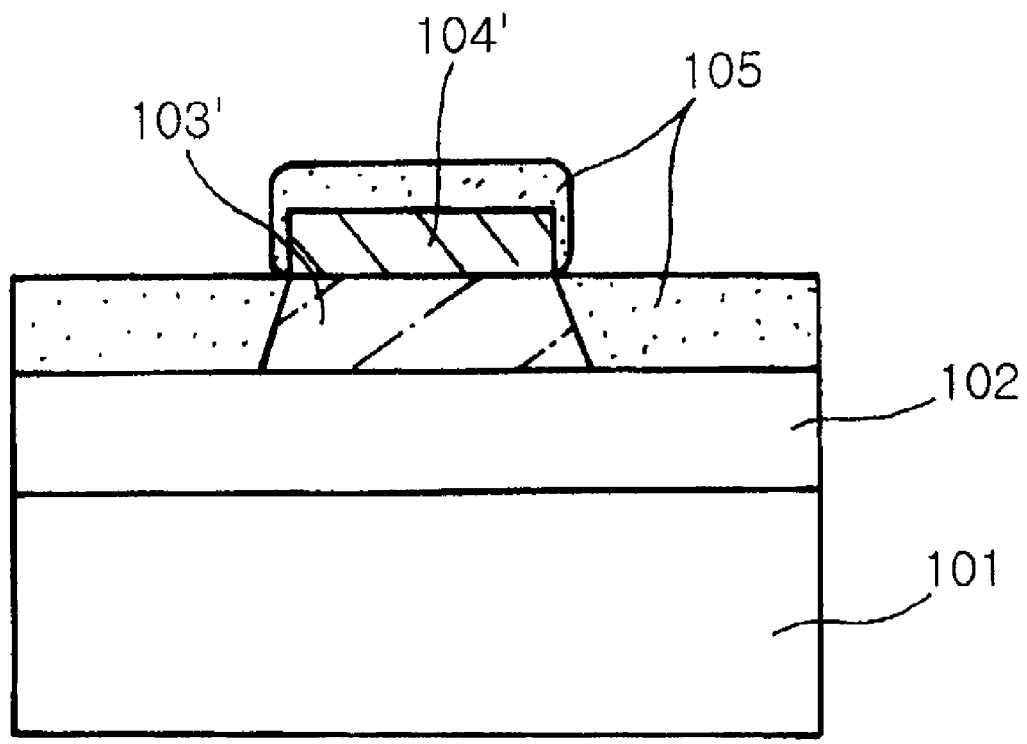

As shown in FIG. 5E, in a state that the photo resist layer 104' is not removed, an insulation material is applied on top surfaces of the insulation layer 102 and the photo resist layer 104'. The photo resist layer 104' defines an area in which a membrane support layer is formed. It is possible that the insulation material is one of $Si_3N_4$, $SiO_2$, and $Al_2O_3$ to form the membrane support layer 105'.

Figure 5F:
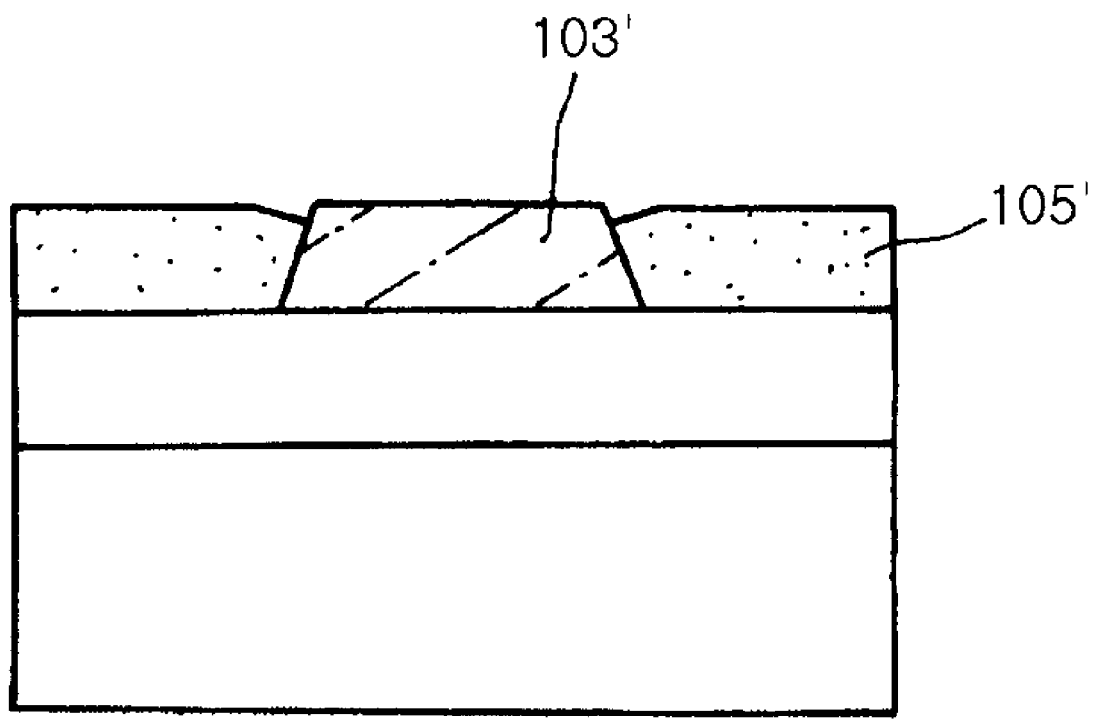

Next, as shown in FIG. 5F, the photo resist layer 104' is removed by using a lift off process. Since the photo resist layer 104' disposed on the sacrificing layer 103' is lifted off from the sacrificing layer 103' after the insulation material is applied on the insulation layer 102 and the photo resist layer 104' without removing the photo resist layer 104' from the sacrificing layer, the membrane layer 105' is formed as shown in FIG. 5F by using this simplified process. Since the photo resist layer 104' is formed with the vertical surface after the sacrificing layer 103' is etched, the wing tip occurred during the lift off process is effectively prevented. That is, the photo resist layer 104' and the insulation material formed on a top surface and side surfaces of the photo resist layer 104' are removed from the sacrificing layer 103'. In this process, since the membrane support layer 105' made of the insulation material is formed on an upper surface of the insulation layer 102 to surround the sacrificing layer 103', a thickness of the insulation layer 106 increases, and the insertion loss is reduced by effectively blocking a signal generated from an electrical pad of the first and second electrode 107, 109 of FIG. 5I from being transmitted to the substrate 101.

A thickness of the sacrificing layer 103' and a thickness of the membrane support layer 105' are between about 0.5 to 5 μm. The sacrificing layer 103' and the membrane support layer 105' does not have to have the same thickness. The membrane support layer 105' may be thicker or thinner than the sacrificing layer 103' if the membrane support layer 105' has a sufficient thickness to support a membrane layer 106 of FIG. 5G. Since an area corresponding to the membrane support layer 105' is not the activation area in FBAR, the membrane support layer 105' of the FBAR does not have to be flat or to have a flatness. Accordingly, The membrane support layer 105' is easily formed by the above simple process without any flattening process of the membrane support layer 105' when the membrane support layer 105' is formed.

Figure 5G:
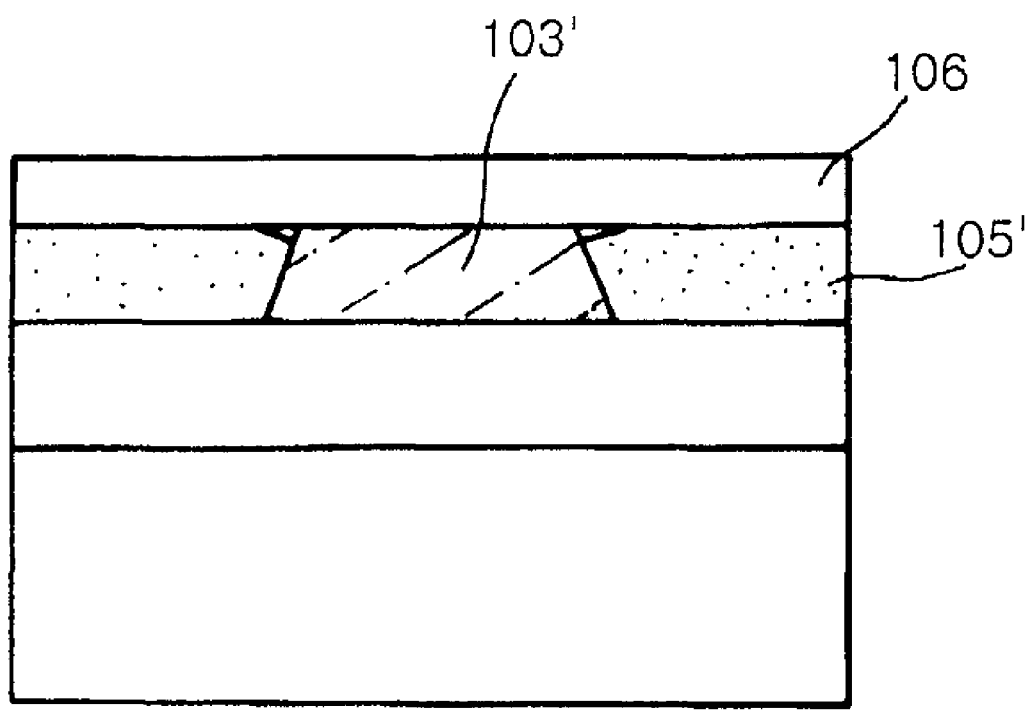
Figure 5H:
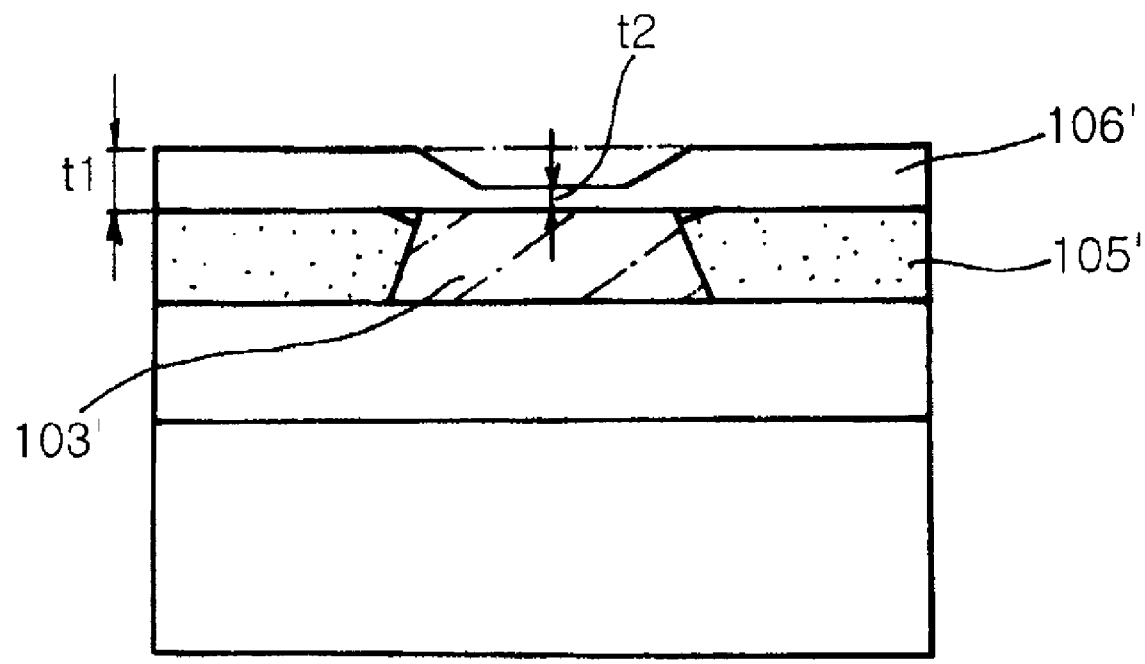

After the membrane support layer 105' is formed, as shown in FIG. 5G, the membrane layer 106 is formed on top surfaces of the sacrificing layer 103' and the membrane support layer 105'. The membrane layer 106 may be made of a conventional material using a conventional deposition method. For example, the membrane layer 106 may be made of $SiO_2$ and has a 1 μm thickness. The membrane layer 106 may be also made of $SiO_2$ having a 1 μm thickness or SiN having 0.5 μm thickness formed on the $SiO_2$. The membrane layer forming process is not limited to the processes described above.

The membrane layer 106 corresponding to the non-activation area has a first thickness t1, and a portion of the membrane layer 106 corresponding to the sacrificing layer 103' or the activation area subsides to have a second thickness t2 less than the first thickness t1. An upper surface of the portion of the membrane 106 corresponding to the activation area is dry etched to lessen the first thickness t1 to the second thickness t2. After the portion of the membrane layer 106 is etched to have the second thickness t2, an inclined portion between the etched portion having the second thickness t2 and the other portion of the membrane layer 106 having the first thickness t1 is formed to decrease a tap resistance and a parallel resonance generated during operating the FBAR. The inclined portion may be formed by the dry etching process after a hard baking process. The inclined portion formed between the activation area and the other portion of the membrane layer 106 may have an angle between about 20 degrees and 80 degrees with respect to a major surface of the membrane layer 106. It is possible that the hard baking process is performed at a temperature between 130 degrees Celsius and 200 degrees Celsius for one to ten minutes. The second thickness t2 of the membrane layer 106 may be about 0% to about 50% of the first thickness t1 to increase an effective transmission and a control gain of a central frequency of the resonance frequency band.

Figure 5I:
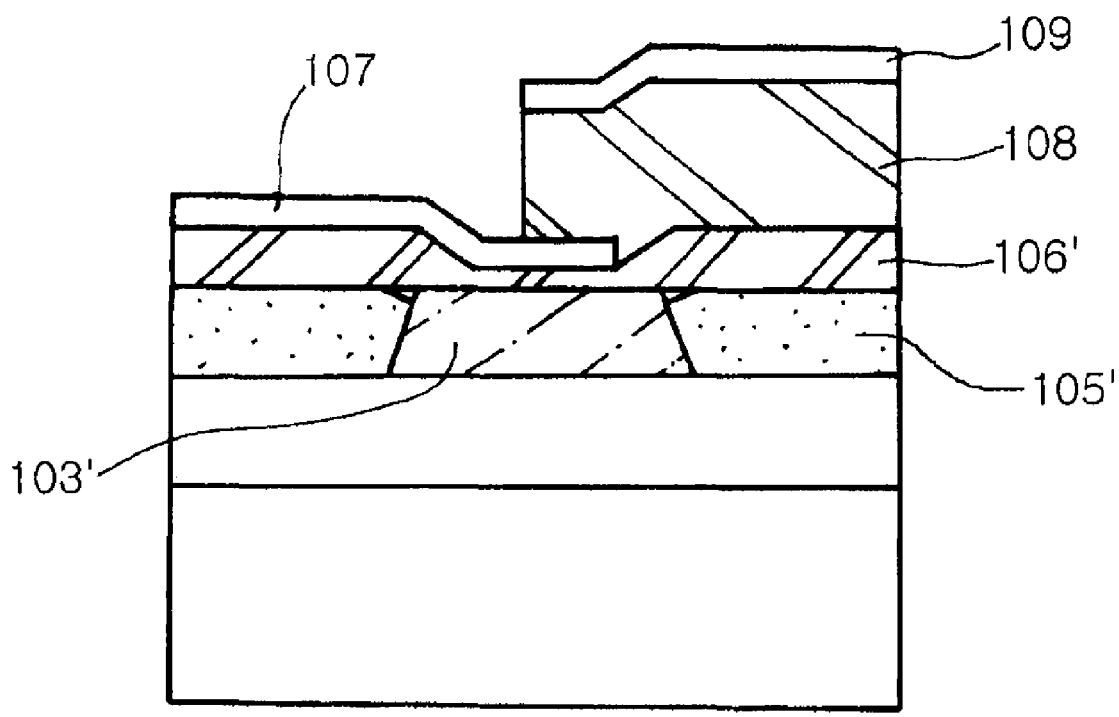

As shown in FIG. 5I, the first electrode 107 is formed on an top surface of the membrane layer 106', the piezoelectric layer 108 is formed on the first electrode layer 107, and the second electrode layer 109 is formed on the piezoelectric layer 108. The first and second layers are made of a conductive material, such as a metal including at least one of Al, W, Au, Pt, Ru, $RuO_2$, and Mo. The piezoelectric layer 108 is made of, but not limited to, Aluminum Nitride (AlN) or ZnO. The piezoelectric layer is formed by using a wet etching process or the dry etching process. If Aluminum Nitride (AlN) is used for forming the piezoelectric layer 108, a gas consisting of at least one selected from a group consisting of Ar, $BCl_3$, $CF_4$ is used to increase an etching angle of the piezoelectric layer 108 having Aluminum Nitride (AlN). The dry etching process is performed when the piezoelectric layer 108 has a relatively high selection ratio with the membrane layer 106' having the thickness t1.

The first electrode 107, the piezoelectric layer 108, and the second electrode layer 109 may have first portions corresponding to the other portion of the membrane layer 106' and the insulation layer 102 and may also have second portions corresponding to the etched portion of the membrane layer and the air gap A3. The first portions are lowered to the second portions through inclined portions formed between respective first and second portions of the first electrode 107, the piezoelectric layer 108, and the second electrode layer 109.

Figure 5J:
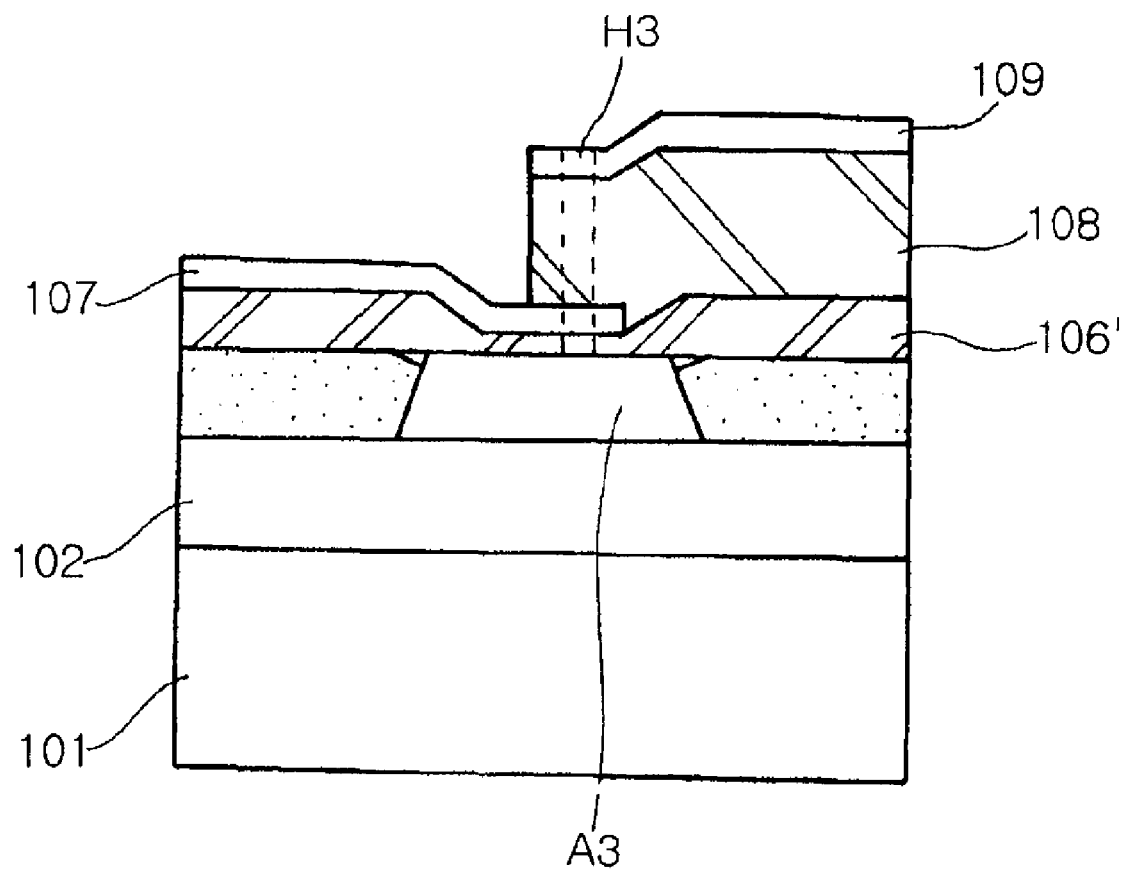

In FIG. 5J, at least one via hole H3 is formed to provide a passage, and the sacrificing layer 103' is removed through the via hole H3 to form the air gap A3. Since the sacrificing layer 103' is made of polysilicon, the wet etching process may be used for removing the sacrificing layer 103' instead of the dry etching process. As a result, a bonding force between the membrane layer 106 and the sacrificing layer 103' is avoided when the sacrificing layer 103' is removed, and the etching process is simplified.

It is possible that xenon difluoride $XeF_2$ may be used as an etching gas used in the dry etching process. The xenon difluoride vaporizes the sacrificing layer 103' by controlling a pressure without using a plasma which is used for etching polysilicon in a micro elector-mechanical system (MEMS).

The FBAR is baked at a temperature of about 140 degrees Celsius for about ten minutes before the dry etching process in order to prevent zenon difluoride $XeF_2$ from forming HF contaminating a surface of the substrate 101.

Generally, the zenon difluoride may etch the polysilicon by several micrometers per minute and has the selection ratio with the silicon oxidation by several thousand to one. Since a photo resist, phosphosilicate glass (PSG), boron and phosphorus doped silicon dioxide (BPSG), Aluminum, silicon nitride, and NiTi as well as the silicon nitride are little etched, if these material are used in a FBAR manufacturing process, the polysilicon layer (the sacrificing layer 103') is etched at a high speed, and easily etched through the via hole due to an isotropic etching characteristic. Thus, a stable air gap A3 is formed using the above simple process due to the high selection ratio with the membrane layer 106' or the membrane support layer 105'.

In the conventional method, since the etchant solution has a high etching ratio with respect to materials forming the piezoelectric layer and the first and second electrodes, a location of the vie hole is very limited. However, in the air gap forming process according to this embodiment of the present invention, the via hole may be formed any portion or a central portion of the sacrificing layer through the piezoelectric layer and the first and second electric layers due to the dry etching process having the high selection ratio. With the high selection ratio, the piezoelectric layer and the first and second electric layers are little etched while the sacrificing layer is etched. Accordingly, since the above efficient etching process is performed to form the vie hole in the central portion of the sacrificing layer even if a minimum number of the vie hole is formed, the sacrificing layer is easily removed using the injected xenon difluoride gas. With the above embodiment, problems relating to the location and the number of the vie holes are solved. The parasite components of the FBAR affecting characteristics of the FBAR is reduced by controlling the location and the number of the via holes.

As shown in 5A–5J, the manufacturing process of the FBAR is illustrated as only one example. That is, operations of the manufacturing process may be performed independently or in a series of combined operations. For example, the dry etching process of forming the air gap by forming the polysilicon layer as the substrate, the forming process of forming the insulation layer to prevent the insertion loss, the controlling operation of controlling the central frequency of the resonance frequency by dry etching the membrane layer, and the improving operation of improving the side profile angle in the photo resist layer are independently performed or are performed in a series of any combination of the above respective operations according to the embodiment of the present invention.

As described above, according to the present invention, by forming an insulation layer having a good quality on a substrate, a signal transmission to the substrate having electric conductivity is prevented, and an insertion loss is minimized. In an operation of forming a sacrificing layer, a flat surface is formed to be substantially perpendicular to the sacrificing layer and the photo resist layer without any wing tip, and a control and transmission gain of a center frequency of the resonance frequency is increased by etching the insulation layer corresponding to an activation area.

Since the sacrificing layer made of the polysilicon layer is dry etched by using the xenon difluoride, the manufacturing process is simplified. In addition, a physical stability of the each component of the FBAR is increased by reducing a bonding force between layers around the air gap. If the xenon difluoride is used as the dry etching gas, since the xenon difluoride has a high selection ratio with which the sacrificing layer and other layers are selectively etched, compared with the material consisting layers surrounding the activation area, the via hole is formed to pass through the activation area to supply the etching gas.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A film bulk acoustic resonator having an activation area resonating with a predetermined frequency signal, said resonator comprising:
   a substrate;
   a signal blocking layer formed on the substrate and made of an insulating material for preventing signals from being transmitted to the substrate;
   a membrane support layer being formed on the insulation layer and having a cavity therein;
   a membrane layer formed on the membrane support layer;
   a first electrode formed on the membrane layer;
   a piezoelectric layer formed on the first electrode layer; and
   a second electrode formed on the piezoelectric layer.

2. The resonator of claim 1, wherein the signal blocking layer is a thermal oxidation layer.

3. The resonator of claim 2, wherein the thermal oxidation layer has a thickness between 0.5 $\mu$m and 5 $\mu$m inclusive.

4. The resonator of claim 1, wherein the signal blocking layer is a thermal oxidation layer having porous silicon.

5. The resonator of claim 4, wherein the thermal oxidation layer has a thickness between 5 $\mu$m and 70 $\mu$m inclusive.

6. The resonator of claim 1, wherein the membrane layer comprises a first portion having a first thickness and a second portion corresponding to the activation area and having a second non-zero thickness being less than the first thickness, said first portion surrounding the second portion.

7. The resonator of claim 6, wherein the second portion of the membrane layer is depressed relative to the first, surrounding portion.

8. The resonator of claim 7, wherein the second depressed portion is formed by a dry etching process.

9. The resonator of claim 7, wherein the second thickness of the membrane layer is about 0~50% of the first thickness.

10. The resonator of claim 1, further comprising:
    at least one via hole formed in the activation area to pass through the first electrode, the piezoelectric layer, and the second electrode to communicate with the cavity.

11. The resonator of claim 10, wherein the via hole is in fluid communication with a central portion of the cavity.

12. The resonator of claim 1, wherein the signal blocking layer is interposed between the air gap and the substrate.

13. The resonator of claim 1, wherein a thickness of said membrane layer in the activation area is less than in a region outside the activation area.

14. The resonator of claim 1, wherein said piezoelectric layer has a trapezoidal shape in plan view.

15. The resonator of claim 14, wherein said trapezoidal shape has two sides converging towards one of said first and second electrodes.

16. The resonator of claim 14, wherein said second electrode also has a trapezoidal shape plan view.

17. The resonator of claim 1, wherein the signal blocking layer and the membrane support layer are made of different materials.

18. The resonator of claim 1, wherein the signal blocking layer defines a bottom of said cavity.

19. A film bulk acoustic resonator having an activation area resonating with a predetermined frequency signal, comprising:
    a substrate;
    a membrane support layer formed an the substrate arid having an air gap;
    a membrane layer formed on the membrane support layer and having a portion corresponding to the activation area and having a thickness less than the other portion of the membrane layer;
    a first electrode formed on the membrane layer;
    a piezoelectric layer formed on the first electrode layer; and
    a second electrode formed on the piezoelectric layer.

20. The resonator of claim 19, wherein the portion of the membrane layer corresponding the activation area is depressed relative to the other portion.

21. The resonator of claim 19, wherein the substrate comprises a high insulation resistance material selected from the group of consisting of non-doped high resistance Si wafer having a resistance greater than 5000Ω, glass wafer, quartz wafer, sapphire, LiNbO₃ and LiTiO₃.

22. A film bulk acoustic resonator having an activation area resonating with a predetermined frequency signal, said resonator comprising:
- a substrate;
- a membrane support layer formed on the substrate and having an air gap;
- a membrane layer formed on the membrane support layer;
- a first electrode formed on the membrane layer;
- a piezoelectric layer formed on the first electrode layer;
- a second electrode formed on the piezoelectric layer; and
- at least one via hole formed in the first electrode, the piezoelectric layer, and the second electrode to communicate with the air gap.

23. The resonator of claim 22, wherein the substrate comprises a high insulation resistance material selected from the group of consisting of non-doped high resistance Si wafer having a resistance greater than 5000Ω, glass wafer, quartz wafer, sapphire, LiNbO₃ and LiTiO₃.

24. A film bulk acoustic resonator having an activation area resonating with a predetermined frequency signal, said resonator comprising:
- a substrate;
- a membrane support layer formed on the substrate and having a cavity therein;
- a membrane layer formed on the membrane support layer;
- a first electrode formed on the membrane layer;
- a piezoelectric layer formed on the first electrode layer;
- a second electrode formed on the piezoelectric layer; and
- at least one via hole formed through the first electrode, the piezoelectric layer, and the second electrode to be in fluid communication with the cavity.

25. The resonator of claim 24, further comprising an insulation layer between the substrate and the membrane support layer.

26. The resonator of claim 25, wherein the insulation layer is a thermal oxidation layer.

27. The resonator of claim 26, wherein the thermal oxidation layer has a thickness between 0.5 μm and 5 μm inclusive.

28. The resonator of claim 25, wherein the insulation layer is a thermal oxidation having porous silicon.

29. The resonator of claim 28, wherein the thermal oxidation layer has a thickness between 5 μm and 70 μm inclusive.

30. The resonator of claim 25, wherein the membrane layer comprises a first portion having a first thickness and a second portion having a second non-zero thickness being less than the first thickness.

31. The resonator of claim 30, wherein the second portion of the membrane layer corresponds to the activation area and is depressed relative to the first portion.

32. The resonator of claim 31, wherein the second, depressed portion is formed by a dry etching process.

33. The resonator of claim 31, wherein the second thickness of the membrane layer is about 0~50% of the first thickness.

34. The resonator of claim 25, wherein said at least one via hole is open to a central portion of the cavity.

35. The resonator of claim 24, wherein the substrate comprises a high insulation resistance material selected from the group of consisting of non-doped high resistance Si wafer having a resistance greater than 5000Ω, glass wafer, quartz wafer, sapphire, LiNbO₃, and LiTiO₃.

36. A film bulk acoustic resonator having an activation area resonating with a predetermined frequency signal, said resonator comprising:
- a substrate;
- a membrane support layer fanned on the substrate and having a cavity;
- a membrane layer being formed on the membrane support layer and comprising a first portion having a first thickness and a second portion corresponding to the activation area and having a second, non-zero thickness which is less than the first thickness;
- a first electrode formed on the membrane layer;
- a piezoelectric layer formed on the first electrode layer; and
- a second electrode formed on the piezoelectric layer.

37. The resonator of claim 36, in said membrane layer has a depression in a region immediately above the cavity, said depression defining said second portion.

* * * * *